(12) United States Patent
Lee et al.

(10) Patent No.: US 7,018,930 B2
(45) Date of Patent: Mar. 28, 2006

(54) METHOD FOR FABRICATING SEMICONDUCTOR DEVICE

(75) Inventors: Sung-Kwon Lee, Kyoungki-do (KR); Sang-Ik Kim, Kyoungki-do (KR); Il-Young Kwon, Kyoungki-do (KR); Kuk-Han Yoon, Kyoungki-do (KR); Phil-Goo Kong, Kyoungki-do (KR); Jin-Sung Oh, Kyoungki-do (KR); Jin-Ki Jung, Kyoungki-do (KR); Jae-Young Kim, Kyoungki-do (KR); Kwang-Ok Kim, Kyoungki-do (KR); Myung-Kyu Ahn, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 191 days.

(21) Appl. No.: 10/292,540

(22) Filed: Nov. 12, 2002

(65) Prior Publication Data
US 2003/0104704 A1    Jun. 5, 2003

(30) Foreign Application Priority Data
Nov. 12, 2001 (KR) ............................... 2001-70223
Sep. 18, 2002 (KR) ............................... 2002-56772

(51) Int. Cl.
*H01L 21/302* (2006.01)
(52) U.S. Cl. ............... 438/706; 438/710; 438/720; 216/58
(58) Field of Classification Search ............... 438/706, 438/710, 712, 714, 720; 216/41, 58, 67; 430/316, 318
See application file for complete search history.

(56) References Cited

U.S. PATENT DOCUMENTS

| | | | | |
|---|---|---|---|---|
| 5,712,185 A | * | 1/1998 | Tsai et al. | 438/424 |
| 6,156,486 A | * | 12/2000 | Hattori et al. | 430/313 |
| 6,221,745 B1 | * | 4/2001 | Fan | 438/592 |
| 6,342,452 B1 | * | 1/2002 | Coronel et al. | 438/710 |
| 6,420,097 B1 | | 7/2002 | Pike et al. | |
| 6,433,436 B1 | * | 8/2002 | Feild et al. | 257/774 |
| 6,444,542 B1 | | 9/2002 | Moise et al. | |
| 6,627,557 B1 | * | 9/2003 | Seta et al. | 438/717 |

FOREIGN PATENT DOCUMENTS

JP    2002-93741    3/2002

* cited by examiner

*Primary Examiner*—Lan Vinh
(74) *Attorney, Agent, or Firm*—Marshall, Gerstein & Borun LLP (57) ABSTRACT

A method for fabricating a semiconductor device capable of minimizing deformations of a photoresist pattern and losses of a hard mask. The method includes the steps of: forming an insulating layer for a hard mask on an etch-target layer; forming a sacrificial layer on the insulating layer; forming a photoresist pattern on the sacrificial layer; forming at least one sacrificial hard mask by etching the sacrificial layer with the photoresist pattern as an etching mask; forming the hard mask by etching the insulating layer with the sacrificial hard mask as an etching mask; and forming a predetermined number of patterns by etching the etch-target layer with use of the sacrificial hard mask and the hard mask as etching masks.

37 Claims, 5 Drawing Sheets

METHOD FOR FABRICATING SEMICONDUCTOR DEVICE

TECHNICAL FIELD

A method for forming a pattern in a semiconductor device is disclosed. More particularly, a method for forming a pattern in a semiconductor device with use of a light source more advanced than $F_2$ or ArF light source is disclosed.

DESCRIPTION OF THE RELATED ART

Photolithography is one of a micro-fabrication technique contributing to progressions of a semiconductor device. Thus, improvement on resolution of photolithography is critically and directly related to a further progression in integration of a semiconductor device.

As is well known, photolithography includes a process for forming a photoresist pattern and a process for forming a line pattern such as a contact hole or a gate electrode by etching a targeted etching layer through an etching process using the photoresist pattern as an etching mask. Herein, the photoresist pattern is formed through a series of processes including a process for coating a photoresist on an etch-target layer, a process for selectively exposing the photoresist with use of a prepared mask and a process for developing the photoresist by a predetermined chemical solution.

Meanwhile, the critical dimension (hereinafter referred as to CD) of a pattern established by the photolithography process is dependent on a wave type of light source in the exposure process. This dependency results from the fact that the width of the photoresist pattern formed through the exposure process determines the CD of an actual pattern.

A stepper previously used employs a light source having a wavelength of 636 nm named as g-line and another light source having a wavelength of 365 nm named as i-line. However, a recent type of the stepper that uses a deep ultra violet (DUV) light source having a wavelength of 248 nm with KrF excimer laser, and a scanner type of a photo exposure equipment are mainly used today.

A photolithography technique employing the 248 nm of the DUV light source has several problems including a time delay and a base material dependency, and thus, this photolithography technique is used in products of a 0.18 μm design. However, it is necessary to develop a new DUV photolithography technology employing a wavelength of a 193 nm with an ArF excimer laser or that of a 157 nm with a $F_2$ laser to enable manufacture of a product having a pattern of below 0.15 μm. Even if various skills are combined together for improving resolution of the DUV photolithography, it is impossible to obtain a pattern of below 0.1 μm. Therefore, there has been actively attempted to develop a new photolithography using a new light source.

The current focus is to develop a pattern with about 0.11 μm by employing a exposure equipment, which uses 193 nm with a ArF laser light source. Despite the fact that the DUV photolithography has excellent resolution for the i-line and depth of focus (DOF), it is difficult to control the process itself. This difficulty can be caused optically due to a short wavelength and chemically due to use of a chemically amplified photoresist.

When the wavelength becomes shorter, CD variation due to a standing wave and overdeveloping by a reflection light due to a difference in substrate phases also become severe. The CD variation means a periodic change of a line width due to a change of interference level between an incident light and a reflection light caused by a minimal thickness difference of a photoresist or that of a substrate film.

A chemical amplification type photoresist is inevitably used to improve sensitivity in the DUV process. However, there arise problems of a post exposure delay (PED) stability, a substrate dependency and the like in connection with reaction mechanisms of the DUV process. Therefore, it is essential to develop a photoresist for $F_2$ or ArF in photolithography technology.

Although $F_2$ or ArF is a chemical amplification type just as KrF, it is required to fundamentally modify a substrate. In particular, it is difficult to develop a substrate used for the ArF photoresist because the benzene ring cannot be used. Herein, the benzene ring is implemented to the krF photoresist for the i-line to secure tolerance for a dry etching process. For instance, in case that the benzene ring is used for the ArF photoresist, light permeability is reduced due to a high level of absorbency in 193 nm, which is a wavelength of the ArF excimer laser. Hence, it is impossible to photo-expose lower sides of the photoresist.

Figure 1:
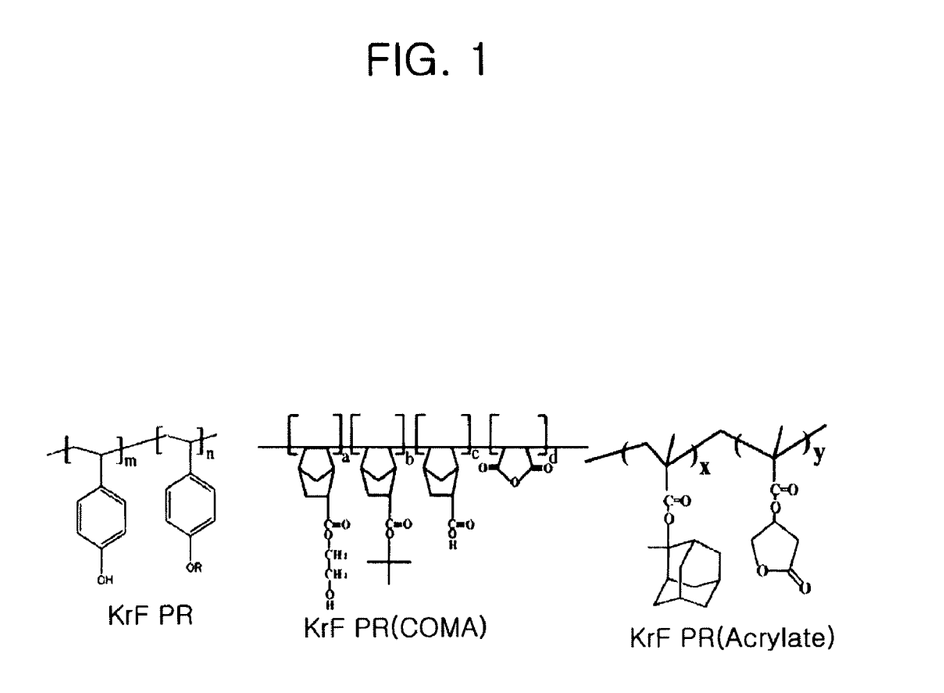
FIG. 1 illustrates chemical structures of $F_2$ and/or ArF photoresists.

Because of this limitation, it has been attempted to develop a substrate that has a good adhesion and is capable of providing tolerance to the dry etching without the benzene ring and being developed with 2.38% of tetra methyl ammonium hydroxide. There are many studies reported currently with respect to those types of the substrate. Among those researched substrates, cycloolefin-maleic anhydride (COMA), acrylate based polymer or mixtures of these two substrates are most commonly used for the photoresist in today. However, the above-mentioned photoresists have the benzene ring structure. FIG. 1 shows each chemical structure of photoresist for KrF and a photoresist for $F_2$ or ArF.

A pattern deformation occurs during a pattern formation process with use of the photoresist for ArF. When proceeding an etching process for forming a pattern through a photo etching using $F_2$ or ArF light source, striations, clusters of a photoresist, plastic deformations and shifting to one side due to a weak tolerance of a photoresist during the etching process all can occur.

Meanwhile, in various types of wiring formation process that uses a metal layer as a conductive wire or in a process for forming a contact hole having a higher aspect ratio, a nitride-based hard mask having an etching selection ratio to a metal layer or an oxide layer is formed on the etch-target layer, i.e., the metal layer and the oxide layer, with consideration of an isolation characteristic between layers.

However, in an etching process with nitride-based hard mask and fluorine-based gas as an etchant, an excessive amount of the etchant reacts with $F_2$ of the acrylate or the photoresist for ArF. Thus, a severe deformation of the photoresist is generated. Also, local damages occur from the etching of the hard mask, e.g., occurrence of a notch due to an irregular thickness of the nitride-based hard mask. Also, the damages from the etching is duplicated to a pattern, which is, in turn, damaged, thereby resulting in a poor quality of a device.

The notch occurs due to local damage of the photoresist caused by a low etching selection ratio of the ArF photoresist and the nitride with respect to fluorine-based gas, e.g., CHF family or CF family, mainly used during the etching of the nitride hard mask with use of the ArF photoresist pattern as an etching mask.

Accordingly, a new process is urgently required to control deformations of the pattern and poor quality due to the low etching selection ratio of the nitride hard mask and the photoresist.

SUMMARY OF THE DISCLOSURE

Therefore, a method for fabricating a semiconductor device is disclosed which is capable of minimizing deformations of a pattern due to losses of the hard mask.

In accordance with an aspect of this disclosure, a method for fabricating a semiconductor device is disclosed which comprise: forming an insulating layer for a hard mask on an etch-target layer; forming at least one sacrificial layer on the insulating layer; forming a photoresist pattern on the sacrificial layer; forming a sacrificial hard mask by etching the sacrificial layer with the photoresist pattern as an etching mask; forming the hard mask by etching the insulating layer with the sacrificial hard mask as an etching mask; and forming a predetermined number of patterns by etching the etch-target layer with use of the sacrificial hard mask and the hard mask as etching masks. The sacrificial hard mask is removed at the step of etching the etch-target layer.

In accordance with another aspect of this disclosure, a method for fabricating a semiconductor device is disclosed which comprises: forming an insulating layer for a hard mask on an etch-target layer; forming at least one sacrificial layer on the insulating layer for the hard mask; forming an antireflection layer on the sacrifice layer; forming a photoresist pattern on the antireflection coating layer; forming a sacrificial hard mask by etching the antireflection layer and the sacrificial layer with the photoresist pattern as an etching mask; forming a hard mask by etching the insulating layer with the sacrifice hard mask as an etching; and forming a predetermined number of patterns by etching the etch-target layer with the sacrifice hard mask and the hard mask as etching masks. The sacrificial hard mask is removed at the step of etching the etch-target layer.

Preferably, a predetermined number of patterns include an intagliated pattern and an embossed pattern. Also, an etch-target layer is an insulating layer or a conductive layer. Particularly, the predetermined number of patterns includes a contact pattern and any one from a group of a bit line, a word line or a metal line.

A sacrificial hard mask is formed on a hard mask, which is formed of oxide-based material or nitride-based material. The sacrificial hard mask is formed with metal or oxide of metal, which has a higher etching selectivity to a photoresist with respect to fluorine-based gas compared to the had mask. In a preferred embodiment, the sacrificial hard mask is formed of tungsten (W), titanium (Ti), platinum (Pt), TiN, TiW and oxide thereof.

In particular, it is targeted to prevent deformations of a pattern and reduce losses of the oxide-based or the nitride-based hard mask caused by a low etching selectivity of the hard mask to the photoresist with respect to the fluorine-based gas in a photo-etch process using a photoresist pattern formed by exposing with ArF or $F_2$ light source.

BRIEF DESCRIPTION OF THE DRAWINGS

The above and other features of the disclosed processes will become apparent from the following description of the preferred embodiments in conjunction with the accompanying drawings, wherein.

DETAILED DESCRIPTION OF THE PRESENTLY PREFERRED EMBODIMENTS

FIGS. 2A to 2D are cross-sectional views illustrating a process for forming a pattern in a semiconductor device with use of $F_2$ or ArF light source in accordance with a first preferred embodiment. The pattern formation process will be described in more detail.

A process for forming a line pattern of a semiconductor device, more particularly, a gate electrode pattern, e.g., a word line, while patterning a conductive layer will now be disclosed. The line pattern, i.e., a conductive pattern to which the disclosed methods are applied is not limited to solely the gate electrode pattern as illustrated in the first preferred embodiment. Indeed, the line pattern is applicable for various types of the pattern formation process such as a bit line, a storage node, a metal line and so forth.

Also, in addition to the line type pattern, the disclosed methods are applicable for an isolated island type and a donut type just as a storage node contact. Instead of applying the patterning to the conductive layer, the disclosed methods are applicable to pattern an insulating layer as well. That is, the first preferred embodiment has an application to a process for forming an embossed pattern.

Figure 2A:
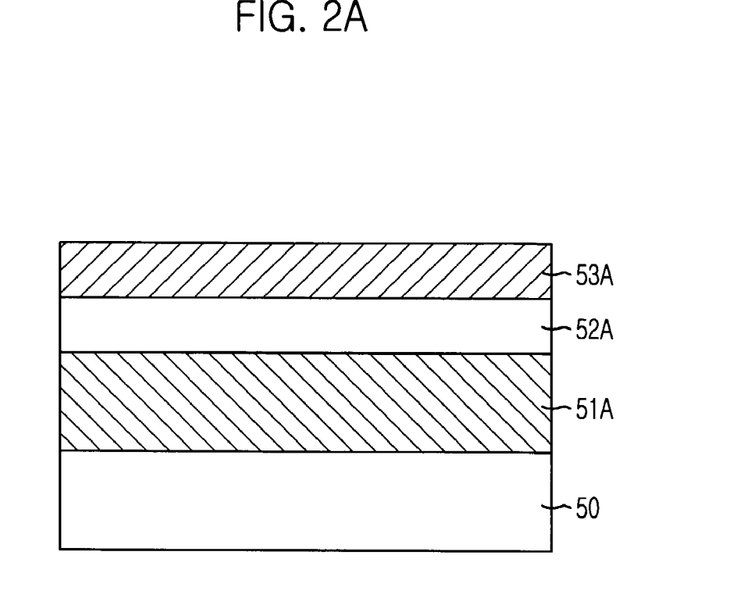
FIGS. 2A to 2D are cross-sectional views illustrating a process for forming a pattern in a semiconductor device by using a F2 or ArF light source in accordance with a first preferred embodiment.

Firstly, with reference to FIG. 2A, a conductive layer 51A is formed on a substrate 50 providing various elements for forming a semiconductor device. The conductive layer 51A is an etch-target layer. Then, an insulating layer 52A for a hard mask is formed on the conductive layer 51A. The insulating layer 51A is formed of an oxide-based thin film such as $SiO_2$ or a nitride-based thin film such as $Si_3N_4$ or SiON. The above-mentioned $SiO_2$, $Si_3N_4$ or SiON is employed to form a hard mask due to the fact that they are insulating materials, yet able to have an etching selectivity to the conductive layer 51A. Afterwards, a sacrificial layer 53A for a sacrificial hard mask is formed on the insulating layer 52A to prevent pattern deformations due to losses of the insulating layer 52A during the etching process.

The sacrificial layer 53A is formed of at least one thin film selected from a group consisting of a polysilicon layer, an Al layer, a W layer, a $WSi_x$ layer, a WN layer, a Ti layer, a TiN layer, a $TiSi_x$ layer, a TiAlN layer, a TiSiN layer, a Pt layer, an Ir layer, an $IrO_2$ layer, a Ru layer, a $RuO_2$ layer, an Ag layer, an Au layer, a Co layer, a TaN layer, a CrN layer, a CoN layer, MoN layer, a $MoSi_x$ layer, an $Al_2O_3$ layer, an AlN layer, a $PtSi_x$ layer and $CrSi_x$ layer. Herein, the subscript x is 1 or 2. Also, a specific thickness of the sacrificial layer 53A is set so that the sacrificial layer 53A can be removed simultaneously when etching the etch-target layer, i.e., the conductive layer 51A. Preferably, each thickness of the sacrificial layer 53A and the insulating layer 52A ranges from about 500 Å to about 3000 Å and from about 500 Å to about 5000 Å.

Furthermore, it is preferable to form the sacrificial layer 53A by employing the same material used for the conductive layer 51A to omit an additional process for removing the sacrifice layer 53A. However, even if the same material is not used, it is still possible to omit a subsequent process for removing the sacrificial layer 53A by controlling properly the thickness and etching conditions in accordance with an etching selectivity of each employed material.

Additionally, the substrate 50 provides an insulating structure and a conductive structure. In the first preferred embodiment, if the conductive layer 51A is for forming the gate electrode pattern, a gate insulating layer (not shown) is formed at an interface between the conductive layer 51A and the substrate 50. In case that the conductive layer 51A is a bit line or a metal line, a plug is formed at the interface between the conductive layer 51A and the substrate 50, that is the plug is formed in an inter-layer insulating layer with a diffusion barrier such as Ti/TiN, a polysilicon layer or a tungsten (W) layer in order to contact the bit line of metal line to an impurity junction layer such as source/drain.

Next, referring to FIG. 2B, an antireflection coating layer 54 (hereinafter referred as to ARC) is formed to prevent a formation of undesired pattern due to scattered reflection resulted from a high optical reflectivity of the sacrificial layer 53A during an exposure process for forming a photoresist pattern on the sacrificial layer 53A and to improve an adhesion strength between the sacrificial layer 53A and a photoresist layer.

Herein, the ARC layer 54 is formed to a thickness preferably ranging from about 100 Å to about 1000 Å by using an organic-based material having an etching characteristic similar to the photoresist.

In continuous to the formation of the ARC layer 54, a photoresist pattern 55 is formed on the ARC layer 54 through a series of procedures in the following. Firstly, a photoresist for $F_2$ light source or ArF light source, e.g., a cycloolefin-maleic anhydride (COMA) or acrylate having the chemical structures shown in FIG. 1 is coated to a proper thickness on the ARC layer 54 through a spin coating technique. Secondly, a predetermined reticle (not shown) for defining gate electrode is used to selectively expose the photoresist with the $F_2$ or ArF light source. Thirdly, a developing process is subsequently proceeded. Lastly, remnants from the developing process are removed through a cleaning process so as to form the photoresist pattern 55.

Next, the ARC layer 54 is selectively etched through a selective etching process by using the photoresist pattern 55 as an etching mask. At this time, in order to minimize losses of the photoresist pattern 55, the selective etching process preferably uses plasma employing chlorine-based gas such as $Cl_2$, $BCl_3$, $CCl_4$ or HCl or another plasma employing CF based gas of which a ratio of carbon (C) and fluorine (F) is low. Herein, the CF based gas is any one gas selected from a group consisting of $CF_4$, $C_2F_2$, $CHF_3$ and $CH_2F_2$.

Since a critical dimension (CD) should be easily controlled when etching the ARC layer 54, the etching process is proceeded with a condition of minimally producing a polymer.

Figure 2B:
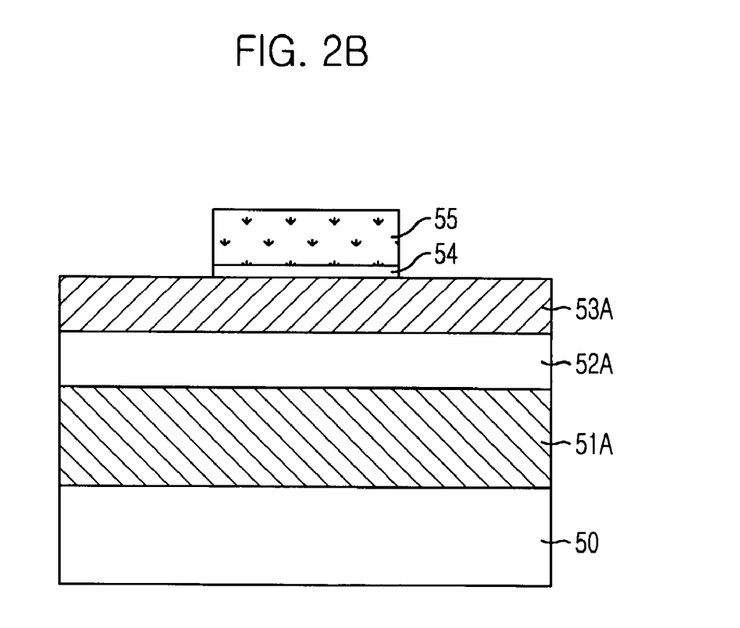
Figure 2C:
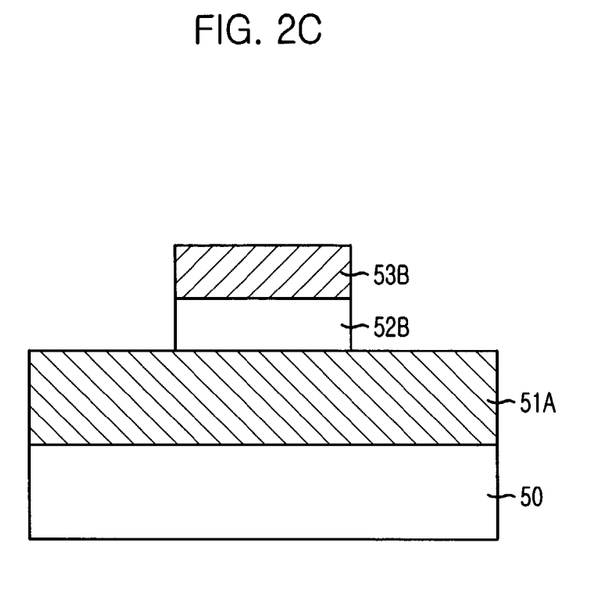

Referring to FIG. 2C, the sacrificial layer 53A is etched by using the photoresist pattern 55 as an etching mask as to form a sacrificial hard mask 53B. At this time, the sacrificial hard mask 53B is used as the etching mask when etching the insulating layer 52A so as to form a hard mask 52B. Although the photoresist pattern 55 and the ARC layer 54 are substantially removed during the etching the insulating layer 52A, there might exist some remnants of the photoresist pattern 55 and the ARC layer 54. Therefore, in case of omitting an additional photoresist strip process for removing the photoresist pattern 55 and the ARC layer 54, the remained photoresist pattern 55 and the ARC layer 54 can act as an undesired etching mask.

In the course of proceeding serial processes, the remained photoresist pattern 55 and the ARC layer 54 are naturally removed.

Hereinafter, the following will explain the etching process of the sacrificial layer 53A and the insulating layer 52A in more detail.

In case that the sacrificial layer 53A is formed of a thin layer including tungsten, e.g., a W layer, a $WSi_x$ layer or a WN layer, plasma including a mixed gas of $SF_6$ and $N_2$ is used as a main etching gas. At this time, a mixing ratio of the $SF_6/N_2$ preferably ranges from about 0.10 to about 0.60.

In case that the sacrificial layer 53A is formed of a polysilicon layer or a thin layer including titanium such as a Ti layer, a TiN layer, a $TiSi_x$ layer, a TiAlN layer, chlorine-based gas, particularly, $Cl_2$ is used as a main etching gas. At this time, $O_2$ or CF gas is added with appropriate amounts to control an etching profile.

In case that the sacrificial layer 53A is formed of metal such as Pt, Ir or Ru, or an oxide of these metals, plasma employing chlorine-based or fluorine-based gas is used. At this time, it is preferable to maintain a low pressure and a high bias power condition since control of the etching profile requires high ion energy.

After forming the sacrificial hard mask 53B, a hard mask 52B pattern formation process is proceeded by selectively etching the insulating layer 52A with use of the sacrificial hard mask 53B as an etching mask. At this time, CF based gas is employed as a main etching gas to etch a nitride-based or an oxide-based material.

Hence, it is possible to prevent pattern deformations typically occurring due to an excessive exposure of the photoresist pattern 55 and the ARC layer 54 used as the etching mask to the etching gas during the etching of the insulating layer 52A.

In other words, in case that the sacrificial hard mask 53B is formed of a tungsten W layer or a TiN layer, the $SF_6/N_2$ is used as the etching gas, and this usage of the mixed gas ultimately prevents a notch caused by local losses of the photoresist pattern 55 because of a higher etching selectivity compared to the insulating layer 52A and the photoresist pattern 55. As a result, it is also possible to prevent losses of the hard mask 52B and the pattern deformations as well.

Also, in case that the sacrificial hard mask 53B is formed with other conductive thin layer except for tungsten, even if the CF base etching gas that may result in the deformations of the photoresist for ArF or $F_2$ is used, it is still possible to prevent typical losses of the hard mask and pattern deformations because the conductive thin layer itself has a higher etching selectivity to the photoresist than the nitride or oxide layers.

Figure 2D:
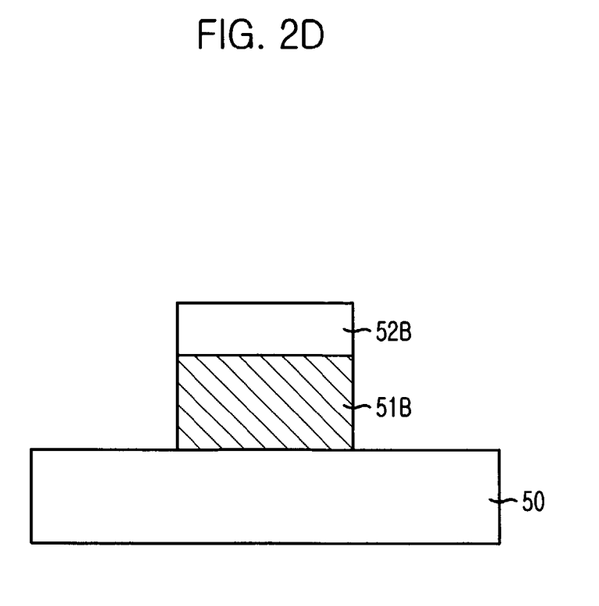

Next, the conductive layer 51A is selectively etched by using the sacrificial hard mask 53B and the hard mask 52B as an etching mask so as to form a conductive pattern 51B, that is, a gate electrode pattern or a bit line pattern.

At this time, in order to omit the above-described additional process for removing the sacrifice hard mask 53B, the sacrificial layer 53A and the conductive layer 53A are formed with same material, or even if the sacrificial layer 53A and the conductive layer 53A are different from each other, a thickness of the conductive layer 51A and etching conditions are controlled to remove all of the sacrificial hard mask 53B during the etching of the conductive layer 51A, thereby omitting the additional process for removing the sacrifice hard mask 53B. Also, the sacrificial hard mask 53B makes it possible to prevent the losses of the hard mask 52B, thereby ultimately preventing deformations of the conductive pattern 51B due to the losses of the hard mask 52B.

Herein, the etching conditions for the conductive layer 51A are the same to those implemented for forming the sacrificial hard mask 53B. The mere difference is the control of a processing time and an amount of gas used.

FIGS. 3A to 3D are cross-sectional views illustrating a process for forming a pattern in a semiconductor device using $F_2$ or ArF light source in accordance with a second preferred embodiment. With reference to FIGS. 3A to 3D, the process for forming a pattern will be described in more detail.

The second preferred embodiment provides a process for forming a space pattern of a semiconductor device, e.g., a contact hole pattern formation process. The contact hole pattern to which the present invention is applied is also applicable for forming a metal line contact and an impurity junction layer contact such as a source/drain junction for a bit line or a storage node contact of a capacitor and a contact pad.

Also, the second preferred embodiment is applicable to a process for forming a trench for isolating a device by using an insulating layer as an etch-target layer. The second preferred embodiment is also applicable for a process wherein an etch-target layer is a conductive layer, e.g., a process for etching a polysilicon layer to open a part for forming a channel of a thin film transistor. In other words, the second preferred embodiment is an application of a process for forming an intagliated pattern.

Figure 3A:
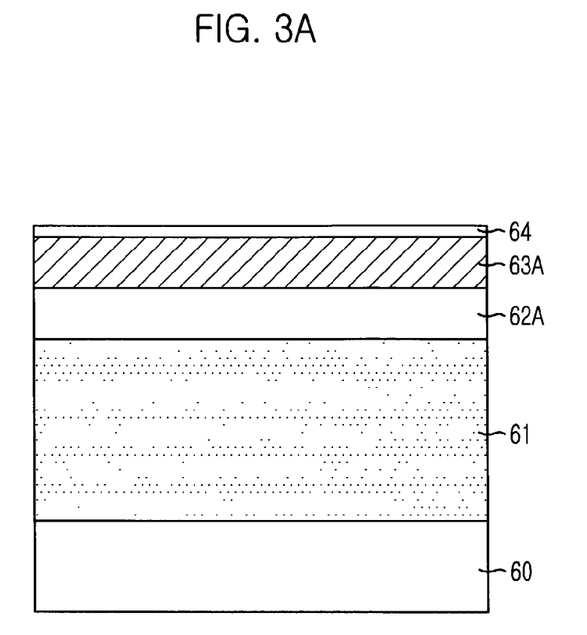
FIGS. 3A to 3D are cross-sectional views illustrating a process for forming a pattern in a semiconductor device with use of F2 or ArF light source in accordance with a second preferred embodiment.

As shown in FIG. 3A, an oxide layer 61 either doped with impurities or undoped with impurities is formed on a substrate 60 providing various elements for forming a semiconductor device. The oxide layer 61 is an etch-target layer. Subsequently, an insulating layer 62A is formed on the oxide layer 61. Thereafter, a sacrificial layer 63A is formed on the insulating layer 62A in order to prevent pattern deformations due to losses of the insulating layer 62A from an etching process.

In this preferred embodiment, the oxide layer 61 is the etch-target layer, the insulating layer 62A is for the hard mask, and the sacrificial layer 63A is for sacrificial hard mask, respectively. However, a thin film such as a low dielectric layer having a similar insulating characteristic can be alternatively used as the etch-target layer in addition to the oxide layer such as $SiO_2$. In this preferred embodiment, a nitride layer is used for a hard mask because it is an insulating material, yet has an etching selectivity to the oxide layer 61. Also, the insulating layer 62A for the hard mask can also alternatively use nitride-based layer having an insulating characteristic and the etching selectivity to the etch-target layer simultaneously. $Si_3N_4$ or SiON are examples of the nitride-based layer.

Herein, the sacrificial layer 63A is formed of at least one thin film selected from a group consisting of a polysilicon layer, an Al layer, a W layer, a $WSi_x$ layer, a WN layer, a Ti layer, a TiN layer, a $TiSi_x$ layer, a TiAlN layer, a TiSiN layer, a Pt layer, an Ir layer, an $IrO_2$ layer, a Ru layer, a $RuO_2$ layer, an Ag layer, an Au layer, a Co layer, a TaN layer, a CrN layer, a CoN layer, MoN layer, a $MoSi_x$ layer, an $Al_2O_3$ layer, an AlN layer, a $PtSi_x$ layer and $CrSi_x$ layer. At this time, a specific thickness of the sacrificial layer 63A is set so that the sacrificial layer 63A is removed when etching the etch-target layer, i.e., the oxide layer 61. Preferably, each thickness of the sacrificial layer 63A and the insulating layer 62A ranges from about 500 Å to about 3000 Å and from about 500 Å to about 5000 Å.

Additionally, an insulating structure and a conductive structure may be provided by the substrate 60. If a contact hole formed in accordance with the second preferred embodiment is for forming a metal line or a contact between the metal lines, the contact hole is formed on a top portion of the substrate 60. In case that the contact hole is for a contact with a bit line, a storage node, a contact pad, a plug made of polysilicon, or an impurity junction layer such as a source/drain junction, the contact hole is formed on a middle or low portion of the substrate 60.

Next, an antireflection coating layer 64 (hereinafter referred as to ARC) is formed to prevent a formation of undesired pattern due to scattered reflection resulted from a high optical reflectivity of the sacrificial layer 63A during an exposure process for forming a photoresist pattern on the sacrificial layer 63A and to improve an adhesion strength between the sacrificial layer 63A and a photoresist.

Herein, the ARC layer 64 is formed to a thickness preferably ranging from about 100 Å to about 1000 Å by using an organic-based material having an etching characteristic similar to the photoresist.

Figure 3B:
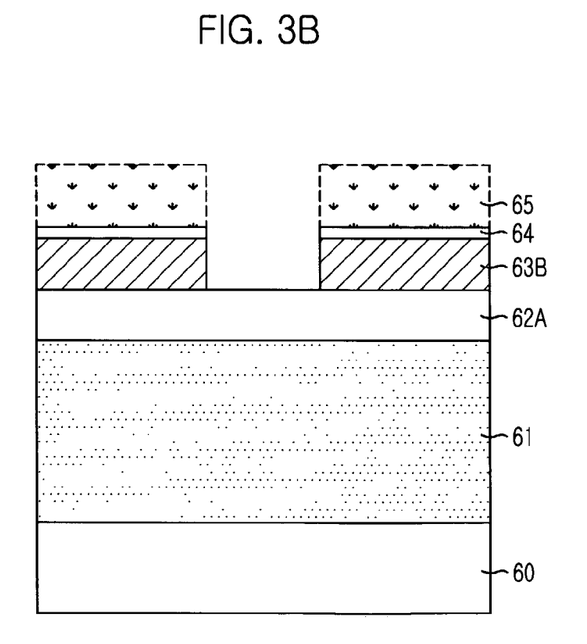

Referring to FIG. 3B, a photoresist pattern 65 is formed on the ARC layer 64 through the same procedures for forming the photoresist pattern 55 shown in FIG. 2B. However, each photoresist pattern 55 and 65 is formed with different reticle, that is, the photoresist pattern 65 is formed with a reticle defining contact hole on the contrary to the photoresist pattern 55 being formed with the reticle defining gate electrode.

Next, the ARC layer 64 is selectively etched through a selective etching process by using the photoresist pattern 65 as an etching mask. At this time, in order to minimize losses of the photoresist pattern 65, the selective etching process preferably uses plasma employing chlorine-based gas such as $Cl_2$, $BCl_3$, $CCl_4$ or HCl or another plasma employing CF based gas of which a ratio of carbon (C) and fluorine (F) is low. Herein, the CF based gas is any one gas selected from a group consisting of $CF_4$, $C_2F_2$, $CHF_3$ and $CH_2F_2$.

Since a critical dimension (CD) should be easily controlled when etching the ARC layer 64, the etching process is proceeded with a condition of minimally producing a polymer.

Subsequently, the sacrificial layer 63A is etched by using the ARC layer 64 and the photoresist pattern 65 as an etching mask so that the sacrificial hard mask 63B are formed.

Hereinafter, the following will explain the etching process of the sacrificial layer 63A in greater detail.

In case that the sacrificial layer 63A includes tungsten (W) such like a W layer, a $WSi_x$ layer or a WN layer, plasma including a mixed gas of $SF_6$ and $N_2$ is used as a main etching gas. At this time, a mixing ratio of the $SF_6/N_2$ preferably ranges from about 0.10 to about 0.60.

In case that the sacrifice layer 63A is formed of a polysilicon layer or a thin film including titanium (Ti) such as a Ti layer, a TiN layer, a $TiSi_x$ layer, a TiAlN layer, chlorine-based gas, particularly, $Cl_2$ is used as a main etching gas. At this time, $O_2$ or CF gas is added with appropriate amounts to control an etching profile.

In case that the sacrificial layer 63A is a thin film including metal such as Pt, Ir or Ru, or an oxide of these metals, plasma employing chlorine-based or fluorine-based gas is used. At this time, it is preferable to maintain a low pressure and a high bias power condition since control of the etching profile requires high ion energy.

Figure 3C:
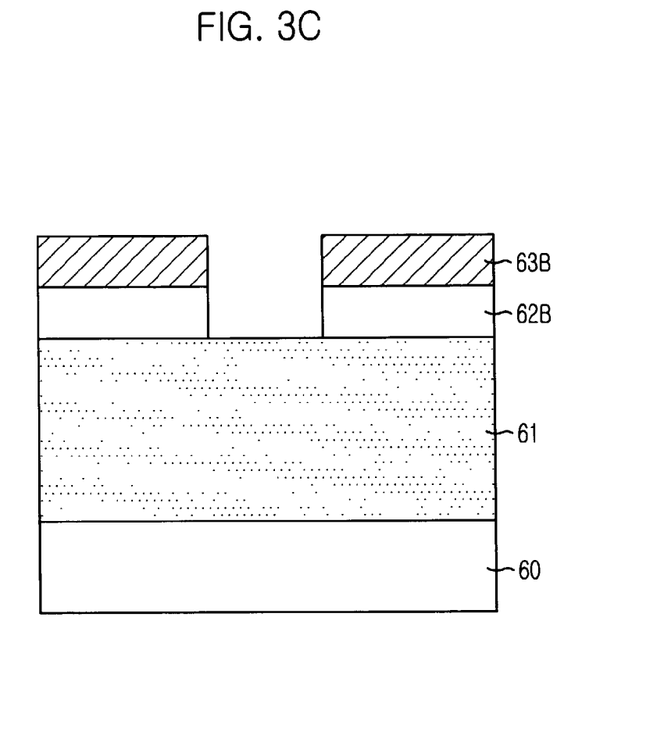

Referring to FIG. 3C, although the photoresist pattern 65 and the ARC layer 64 are mostly removed during the etching sacrificial layer 63A, there might exist some remnants of the photoresist pattern 55 and the ARC layer 54. Therefore, in case of omitting an additional photoresist strip process for removing the photoresist pattern 65 and the ARC layer 64, the remained photoresist pattern 65 and the ARC layer 64 can enact as an undesired etching mask. For this reason, the insulating layer 62A is etched to form a hard mask 62B by using the sacrifice hard mask 63B as an etching mask. During the formation of the hard mask 62B, the remained photoresist pattern 65 and the ARC layer 64 are naturally removed.

After forming the sacrificial hard mask 63B, a hard mask 62B pattern formation process is proceeded by selectively etching the insulating layer 62A with use of the sacrificial hard mask 63B as an etching mask. At this time, CF based gas used in etching a nitride-based or an oxide-based material is employed as a main etching gas.

Hence, it is possible to prevent pattern deformations typically occurring due to an excessive exposure of the photoresist pattern 65 and the ARC layer 64 used as the etching mask to the etching gas during the etching of the insulating layer 62A.

Figure 3D:
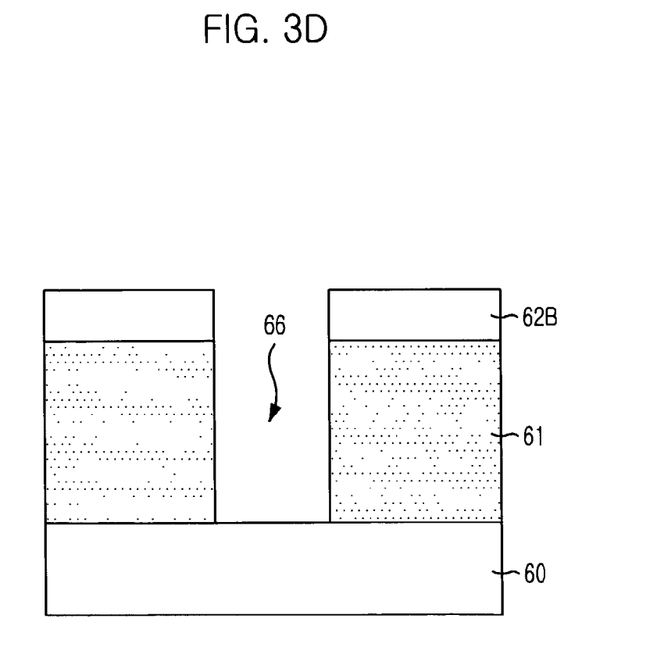

With reference to FIG. 3D, the oxide layer 61 is selectively etched by using the sacrifice hard mask 63B and the hard mask 62B as an etching mask so as to form a contact hole that exposes the substrate 60, more particularly, a surface of a conductive structure on the substrate 60.

At this time, when etching the oxide layer 61, process conditions, i.e., a thickness and an etching condition is controlled to omit the additional etching process for removing the sacrifice hard mask 63B. Also, it is possible to prevent the losses of the hard mask 62B due to usage of the sacrificial hard mask 63B, thereby further prevention of pattern deformations such as an increase or a decrease in critical dimension (CD) of the contact hole 66 due to the losses from the hard mask 62B.

The etching conditions of the above-mentioned etch-target layer, that is, the oxide layer 61 will be explained in more detail.

For the etching of the oxide layer 61, CF based gas such as $CF_4$, $CHF_3$, $CH_2F_2$, $C_4F_6$, $C_4F_8$, $C_3F_8$ or $C_5F_8$ is used. At this time, a flow rate of the CF based gas is set to be in a range from about 20 SCCM to about 100 SCCM and about 1000 W to 2500 W of power is applied to a magnetic enhancement reactive ion etching(MERIE) chamber. Besides the MERIE chamber, the oxide layer 61 can be etched in a chamber, such as an electro-cyclotron resonance (RCE) chamber, an induced coupled plasma(ICP) chamber, a transmittance coupled plasma(TCP) chamber and an reactive ion etching(RIE) chamber.

Concurrently, a pressure inside of the etcher is maintained within a range from about 25 mTorr to about 70 mTorr, while a temperature of a cathode ranges from about 20° C. to about +60° C. Also, oxygen gas can be added with a flow rate that is about 65% to about 80% of the flow rate of the CF based gas.

A plurality of the conductive layers, e.g., a W layer or a WN layer, are used in a stacked structure on top of the insulating hard mask, e.g., the nitride layer. Therefore, it is possible to prevent local losses of the photoresist due to a low etching selectivity between the insulating hard mask and the photoresist with respect to the CF based etching gas. This ability to prevent the local losses of the photoresist further results in the prevention of the losses of the insulating hard mask and pattern deformations. Moreover, this minimal losses of the hard mask ultimately improves yields of semiconductor devices.

In addition, both preferred embodiments demonstrate that the process for removing the sacrificial hard mask is not additionally required since the sacrificial hard mask can be removed simultaneously as etching the etch-target layer such as the oxide layer or the conductive layer.

While the disclosed processes have been described with respect to certain preferred embodiments, it will be apparent to those skilled in the art that various changes and modifications may be made without departing from the scope of this disclosure as defined in the following claims.

What is claimed is:

1. A method for fabricating a semiconductor device, comprising:
    forming an insulating layer on an etch-target layer;
    forming at least one sacrificial layer on the insulating layer, wherein the sacrificial layer is at least one layer selected from the group consisting of a polysilicon layer, an Al layer, a W layer, a $WSi_x$ layer, a WN layer, a Ti layer, a TiN layer, a $TiSi_x$ layer, a TiAlN layer, a TiSiN layer, a Pt layer, an Ir layer, an $IrO_2$ layer, a Ru layer, a $RuO_2$ layer, an Ag layer, an Au layer, a Co layer, a TaN layer, a CrN layer, a CoN layer, MoN layer, a $MoSi_x$ layer, an $Al_2O_3$ layer, an AlN layer, a $PtSi_x$ layer, and $CrSi_x$ layer, and wherein x is 1 or 2;
    forming a photoresist pattern on the sacrificial layer; and
    sequentially performing at least three etching processes including:
    (a) etching the sacrificial layer using the photoresist pattern as an etching mask and without substantially etching the insulating layer to form a sacrificial hard mask;
    (b) etching the insulating layer using the sacrificial hard mask as an etching mask without substantially etching the etch-target layer to form a hard mask; and
    (c) etching the etch-target layer using the sacrificial hard mask and the hard mask as etching masks to form a predetermined number of patterns.

2. The method as recited in claim 1, wherein the etch-target layer is an insulating layer and the predetermined number of patterns are contact hole patterns.

3. The method as recited in claim 1, wherein the etch-target layer is a conductive layer and the predetermined number of patterns is a word line, a bit line or a metal line.

4. The method as recited in claim 1, wherein the photoresist pattern is formed with a ArF light source or a $F_2$ light source.

5. The method as recited in claim 1, wherein the sacrificial hard mask is removed during the etching of the etch-target layer.

6. The method as recited in claim 1, wherein the etch-target layer is an oxide-based layer, and the insulating layer is a nitride-based layer.

7. The method as recited in claim 1, wherein the etch-target layer and the sacrificial layer are formed of same material.

8. The method as recited in claim 1, wherein the sacrificial layer includes tungsten (W), and a plasma comprising a $SF_6N_2$ gas mixture having a mixing ratio within a range between about 0.10 to about 0.60 is used to etch the sacrificial layer.

9. The method as recited in claim 1, wherein sacrificial layer includes polysilicon or titanium (Ti), and a chlorine-based gas is used as a main etching gas and oxygen or fluorocarbon (CF) gas is added to control an etching profile.

10. The method as recited in claim 1, wherein the sacrificial layer includes at least one metal selected from the group consisting of Pt, Ir and Ru, and a chlorine-based or a CF-based gas is used as a main etching gas.

11. The method as recited in claim 7, wherein the insulating layer is an oxide-based layer or a nitride-based layer.

12. The method as recited in claim 11, at the step of forming the hard mask, the insulating layer is etched with a CF-based gas.

13. A method for fabricating a semiconductor device, comprising:
forming an insulating layer on an etch-target layer;
forming at least one sacrificial layer on the insulating layer, wherein the sacrificial layer is at least one layer selected from the group consisting of a polysilicon layer, an Al layer, a W layer, a $WSi_x$ layer, a WN layer, a Ti layer, a TiN layer, a $TiSi_x$ layer, a TiAlN layer, a TiSiN layer, a Pt layer, an Ir layer, an $IrO_2$ layer, a Ru layer, a $RuO_2$ layer, an Ag layer, an Au layer, a Co layer, a TaN layer, a CrN layer, a CoN layer, MoN layer, a MoSi layer, an $Al_2O_3$ layer, an AlN layer, a $PtSi_x$ layer, and $CrSi_x$ layer, and wherein x is 1 or 2;
forming an antireflection coating layer on the sacrifice layer;
forming a photoresist pattern on the antireflection coating layer;
sequentially performing at least three sequential etching processes, including:
(a) etching the antireflection coating layer and the sacrificial layer using the photoresist pattern as an etching mask without substantially etching the insulating layer to form a sacrificial hard mask;
(b) etching the insulating layer using the sacrificial hard mask as an etching mask without substantially etching the etch-target layer to form a hard mask; and
(c) etching the etch-target layer using the sacrificial hard mask and the hard mask as etching masks to form a predetermined number of patterns.

14. The method as recited in claim 13, wherein the antireflection layer is etched with a chlorine-based or a fluorocarbon (CF)-based gas.

15. The method as recited in claim 13, wherein the photoresist pattern is formed with an ArF light source or a $F_2$ light source.

16. The method as recited in claim 13, wherein the etch-target layer and the sacrificial layer are formed of same material.

17. The method as recited in claim 13, wherein the sacrificial hard mask is removed during etching of the etch-target layer.

18. The method as recited in claim 13, wherein the etch-target layer is an oxide-based layer, and the insulating layer for the hard mask is a nitride-based layer.

19. A method for fabricating a semiconductor device, comprising:
forming an insulating layer for a hard mask on an etch-target layer;
forming at least one sacrificial layer on the insulating layer, wherein the sacrificial layer includes tungsten (W);
forming a photoresist pattern on the sacrificial layer;
forming a sacrificial hard mask by etching the sacrificial layer using the photoresist pattern as an etching mask and using a plasma of a $SF_6/N_2$ gas mixture having a mixing ratio within a range of between about 0.10 to about 0.60;
forming the hard mask by etching the insulating layer using the sacrificial hard mask as an etching mask; and
forming a predetermined number of patterns by etching the etch-target layer using the sacrificial hard mask and the hard mask as etching masks.

20. The method as recited in claim 19, wherein the etch-target layer is an insulating layer and the predetermined number of patterns are contact hole patterns.

21. The method as recited in claim 19, wherein the etch-target layer is a conductive layer and the predetermined number of patterns is a word line, a bit line or a metal line.

22. The method as recited in claim 19, wherein the photoresist pattern is formed with an ArF light source or a $F_2$ light source.

23. The method as recited in claim 19, wherein the sacrificial hard mask is removed during etching of the etch-target layer.

24. The method as recited in claim 19, wherein the etch-target layer is an oxide-based layer, and the insulating layer for the hard mask is a nitride-based layer.

25. The method as recited in claim 19, wherein the sacrificial layer includes at least one layer selected from the group consisting of a polysilicon layer, an Al layer, a W layer, a $WSi_x$ layer, a WN layer, a Ti layer, a TiN layer, a $TiSi_x$ layer, a TiAlN layer, a TiSiN layer, a Pt layer, an Ir layer, an $IrO_2$ layer, a Ru layer, a $RuO_2$ layer, an Ag layer, an Au layer, a Co layer, a TaN layer, a CrN layer, a CoN layer, MoN layer, a $MoSi_x$ layer, an $Al_2O_3$ layer, an AlN layer, a $PtSi_x$ layer, and $CrSi_x$ layer, and wherein x is 1 or 2.

26. The method as recited in claim 25, wherein sacrificial layer includes polysilicon or titanium (Ti), and a chlorine-based gas is used as a main etching gas and oxygen or fluorocarbon (CF) gas is added to control an etching profile.

27. The method as recited in claim 25, wherein the sacrificial layer includes at least one metal selected from the group consisting of Pt, Ir and Ru, and a chlorine-based or a CF-based gas is used as a main etching gas.

28. The method as recited in claim 19, wherein the etch-target layer and the sacrificial layer are formed of same material.

29. The method as recited in claim 28, wherein the insulating layer for the hard mask is an oxide-based layer or a nitride-based layer.

30. The method as recited in claim 29, at the step of forming the hard mask, the insulating layer is etched with a CF-based gas.

31. A method for fabricating a semiconductor device, comprising:
forming an insulating layer for a hard mask on an etch-target layer;
forming at least one sacrificial layer on the insulating layer for the hard mask, wherein the sacrificial layer includes tungsten (W);
forming an antireflection layer on the sacrifice layer;
forming a photoresist pattern on the antireflection coating layer;
forming a sacrificial hard mask by etching the antireflection layer and the sacrificial layer using the photoresist pattern as an etching mask, and using a plasma of a $SF_6/N_2$ gas mixture having a mixing ratio within a range of between about 0.10 to about 0.60;
forming a hard mask by etching the insulating layer using the sacrifice hard mask as an etching mask; and
forming a predetermined number of patterns by etching the etch-target layer with the sacrifice hard mask and the hard mask as etching masks.

32. The method as recited in claim 31, wherein the antireflection layer is etched with a chlorine-based or fluorocarbon (CF)-based gas.

33. The method as recited in claim 31, wherein the photoresist pattern is formed with an ArF light source or a $F_2$ light source.

34. The method as recited in claim 31, wherein the etch-target layer and the sacrificial layer are formed of same material.

35. The method as recited in claim 31, wherein the sacrificial hard mask is removed during the etching of the etch-target layer.

36. The method as recited in claim 31, wherein the sacrificial layer further includes at least one layer selected from the group consisting of a polysilicon layer, an Al layer, a W layer, a WSi$_x$ layer, a WN layer, a Ti layer, a TiN layer, a TiSi$_x$ layer, a TiAlN layer, a TiSiN layer, a Pt layer, an Ir layer, an IrO$_2$ layer, a Ru layer, a RuO$_2$ layer, an Ag layer, an Au layer, a Co layer, a TaN layer, a CrN layer, a CoN layer, MoN layer, a MoSi$_x$ layer, an Al$_2$O$_3$ layer, an AlN layer, a PtSi$_x$ layer, and CrSi$_x$ layer, and wherein x is 1 to 2.

37. The method as recited in claim 31, wherein the etch-target layer is an oxide-based layer, and the insulating layer for the hard mask is a nitride-based layer.

* * * * *